(12) United States Patent
Denisyuk et al.

(10) Patent No.: US 10,832,918 B2
(45) Date of Patent: Nov. 10, 2020

(54) METHOD FOR REMOVAL OF MATTER

(71) Applicants: TESCAN Brno, s.r.o., Brno (CZ); TESCAN ORSAY HOLDING a.s., Brno (CZ)

(72) Inventors: Andrey Denisyuk, Brno (CZ); Sharang Sharang, Brno (CZ); Jozef Vincenc Obona, Hodrusa-Hamre (CZ)

(73) Assignees: Tescan Brno, s.r.o., Brno (CZ); Tescan.Orsay Holding A.S., Brno (CZ)

( * ) Notice: Subject to any disclaimer, the term of this patent is extended or adjusted under 35 U.S.C. 154(b) by 85 days.

(21) Appl. No.: 16/044,715

(22) Filed: Jul. 25, 2018

(65) Prior Publication Data
US 2019/0074184 A1 Mar. 7, 2019

(30) Foreign Application Priority Data
Jul. 25, 2017 (CZ) .................................... 2017-424

(51) Int. Cl.
| | |
|---|---|
| *C23F 4/00* | (2006.01) |
| *H01L 21/3065* | (2006.01) |
| *H01J 37/305* | (2006.01) |
| *H01L 21/263* | (2006.01) |
| *H01L 21/66* | (2006.01) |

(52) U.S. Cl.
CPC ............ *H01L 21/3065* (2013.01); *C23F 4/00* (2013.01); *H01J 37/3056* (2013.01); *H01L 21/2633* (2013.01); *H01L 22/12* (2013.01); *H01J 2237/3114* (2013.01); *H01J 2237/31749* (2013.01)

(58) Field of Classification Search
CPC ...... C23F 4/00; H01L 21/263; H01L 21/2633; H01J 2237/31749
See application file for complete search history.

(56) References Cited

U.S. PATENT DOCUMENTS

| | | | | |
|---|---|---|---|---|
| 5,086,015 A | * | 2/1992 | Itoh .................. | H01L 21/76802 148/DIG. 46 |
| 5,840,630 A | * | 11/1998 | Cecere ................ | C23F 4/00 438/712 |
| 5,851,413 A | * | 12/1998 | Casella ............... | H01J 37/3002 216/92 |
| 8,288,737 B1 | * | 10/2012 | Walck ................ | H01J 37/32082 250/306 |
| 2002/0195422 A1 | * | 12/2002 | Sievers ............... | C23F 4/00 216/62 |

(Continued)

OTHER PUBLICATIONS

Das, Kallol, et al., "Mechanisms of material removal and mass transport in focused ion beam nanopore formation". Journal of Applied Physics 117, 085304 (2015). pp. 1-14.*
Volkert, C.A., et al., "Focused Ion Beam Microscopy and Micromachining". MRS Bulletin, vol. 32, May 2007, pp. 389-399; www/mrs.org/bulletin.*

(Continued)

*Primary Examiner* — Bret P Chen
(74) *Attorney, Agent, or Firm* — Thedford I. Hitaffer; Hitaffer & Hitaffer, PLLC

(57) ABSTRACT

A method of uniformly removing material from a sample surface includes the steps of sputtering by means of scanning the surface with a focused ion beam and a simultaneous observing of the sample during sputtering. Uniform sputtering of different materials is achieved by high-angle sputtering from multiple directions, wherein the directions are rotated relative to each other by a non-zero angle.

8 Claims, 6 Drawing Sheets

(56) References Cited

U.S. PATENT DOCUMENTS

| | | | | |
|---|---|---|---|---|
| 2006/0097184 A1* | 5/2006 | Frosien | ............... | H01J 37/145 |
| | | | | 250/396 R |
| 2008/0073586 A1* | 3/2008 | Iwasaki | ............. | G01N 23/2251 |
| | | | | 250/492.21 |
| 2009/0114840 A1* | 5/2009 | Ward | ...................... | H01J 27/26 |
| | | | | 250/423 F |
| 2012/0145534 A1* | 6/2012 | Kageyama | .......... | C23C 14/3464 |
| | | | | 204/192.11 |
| 2012/0298884 A1 | 11/2012 | Nakajima et al. | | |
| 2013/0319849 A1* | 12/2013 | Fuller | ................ | H01J 37/3026 |
| | | | | 204/192.34 |
| 2014/0357088 A1* | 12/2014 | Rue | .................. | H01L 21/76892 |
| | | | | 438/723 |
| 2016/0343903 A1* | 11/2016 | Ueta | ...................... | H01L 33/16 |

OTHER PUBLICATIONS

Schilling, A., et al., "Strategies for gallium removal after focused ion beam patterning of ferroelectric oxide nanostructures". Nanotechnology 18 (2007) 035301, pp. 1-5.*

Luo, Hu, et al., "Focused ion beam built-up on scanning electron microscopy with increased milling precision". Science China Physics, Mechanics & Astronomy, Apr. 2012, vol. 55 No. 4: 625-630.*

Li, Chen, et al., "An improved FIB sample preparation technique for site-specific plan-view specimens: A new cutting geometry". Ultramicroscopy 184 (2018) 310-317.*

Yamaguchi, H., et al., "Characteristics of silicon removal by fine focused gallium ion beam". Journal of Vacuum Science & Technology B: Microelectronics Processing and Phenomena 3, 71 (1985). Abstract Only.*

\* cited by examiner

METHOD FOR REMOVAL OF MATTER

CROSS-REFERENCE TO RELATED APPLICATIONS

This application claims priority from CZ Patent Application No. CZ 2017-424, filed Jul. 25, 2017, the disclosure of which is incorporated herein by reference.

FIELD OF THE INVENTION

Present invention relates to a method of uniformly removing material layers from the surface of samples, particularly of semiconductor devices, by sputtering the surface of the sample by means of scanning the sample with focused ion beam.

BACKGROUND OF THE INVENTION

Increasing demands on the power of semiconductor devices and their constant downsizing result in the manufacture of semiconductor devices with very high density of semiconductor components. In traditional semiconductor devices, semiconductor components are placed into individual layers which are placed on top of each other. In order to display and examine semiconductor components located in deeper layers of the semiconductor device, for example for fault analysis or reverse engineering, it is necessary first to remove the mass of the semiconductor device overlapping said components.

One of the methods to remove the upper layers of semiconductor devices that has been used so far is mechanical polishing. Although this method is relatively fast, it leaves deep grooves on the surface of the treated device, which must be in the following step removed by another method. Mechanical polishing also generally affects and damages a relatively large area of the semiconductor device.

Another method for removal of the material of the semiconductor device is sputtering by means of a particle beam with high momentum. Upon impact of a particle with a high momentum to the sample surface, a part of the mass is ejected out of the sample surface, i.e. sputtering is achieved. This effect is used, for example, in the so-called broad ion beam (BIB) ion polishers. Such a device typically comprises an ion source and a means for conducting the ion beam towards the semiconductor device. The drawback of this device is that different sputtering rates of the material can lead to undesirable unevenness on the treated surface. To eliminate such unevenness, rotation and optionally also tilting of the sample during sputtering are successfully used, as described in patent application US 20120298884 A1. The process of sputtering can be monitored by optical microscopy or by scanning electron microscope (SEM). The drawback of optical microscopy is low resolution, which does not allow distinguishing detailed structures of the semiconductor device. In contrast, SEM provides sufficient resolution. The drawback of SEM is that when polishing by BIB, large amount of signal particles is released from the sputtered area, causing large interference to the detector and making it impossible to display the area. If the sample is to be well observed by SEM, it must be also stationary relative to the scanning microscope and should not be simultaneously irradiated with BIB. A device comprising simultaneous use of SEM and BIB is described, for example, in patent application No. US 20120298884 A1, however, SEM of the claimed device does not serve to observe the surface during sputtering but to determine the end point of sputtering by spatial distribution of signal electrons.

The aforementioned drawbacks can be eliminated by sputtering of material from surface using a focused ion beam (FIB). FIB, unlike BIB, is a convergent beam concentrating ions impinging on a sample into a very small area. At present, it is common practice to use FIB to sputter small volumes of material (so-called sputtering). In the semiconductor industry, however, emphasis is placed on sputtering of much larger areas or volumes (so-called delayering), from surfaces of semiconductor devices that generally contain multiple components with different sputtering rates. When sputtering, it often happens that, due to different sputtering rates, unevenness impedes further investigation. Such unevenness is often reduced in practice by, for example, suitably set endpoint detection or using gases to homogenize the surface before or during sputtering. Said methods, however, are relatively time consuming and require an experienced operator. Often it is also necessary to modify system parameters during sputtering. A significant advantage would certainly be the visualization of the sputtering process by SEM because of the high resolution, or the use of (particulate) matter after sputtering for additional analyses based on their properties.

SUMMARY OF THE INVENTION

The subject matter of the present invention is to provide a method of removing one or more layers of matter from a selected area by sputtering a sample by scanning the sample surface with a focused ion beam (FIB), consisting in that a selected area is sputtered from multiple directions at a small angle so that in the first step, the sample is placed in a first position relative to the FIB, and the first scanning area including the selected area is sputtered in the first direction using the FIB, and in at least one further step, the sample is placed in a second position relative to the FIB, and the second scanning area including the selected area is sputtered by the FIB, wherein the first sputtering direction and the second sputtering direction are rotated relative to each other. The axis of the ion column forming the FIB and the normal of the selected area are at angle $\alpha$ of 70 to 90 degrees.

A method of carrying out the invention comprises a first step in which a sample is placed in a first position relative to the FIB. Subsequently, in the first position, a first scanning area on the sample is sputtered by the FIB. The method further comprises at least one second step in which the sample is placed in a second position relative to the FIB. In the second position, a second scanning area on the sample is sputtered by the FIB. The second position can be rotated relative to the first position about a normal perpendicular to the sample surface by angle $\beta$, with the scanning areas at least partially overlapping. The selected area is located in the overlap of the scanning areas. As used herein, the angle of rotation $\beta$ means an angle formed by two projections of the FIB axis onto the surface plane of the selected area in individual positions, or between the sputtering directions. These steps can be repeated until an approximately flat and smooth surface is formed in the selected area at the desired depth, for example in a predetermined layer of the semiconductor device. Ideally, the individual positions are always rotated by the same angle relative to the previous position. In addition, all the positions can be tilted by the same angle $\alpha$, which is formed by the normal of the selected area and the FIB axis. Sputtering from the sample at the angle $\alpha$ from multiple directions greatly reduces the formation of surface unevenness when sputtering from components with different sputtering rates.

As used herein, the term scanning is intended to mean systematic and gradual passing of the FIB over the scanning area on the sample. During the scanning, the FIB follows generally a linear path and, if it reaches the edge of the scanning area, it moves or changes direction and begins to follow another linear path until the entire scanning area is scanned.

The mass of the sample may be composed of two or more components having different sputtering rates. The components may be made of the same material containing, for example, particles of different spatial orientation, or they may be made of plurality of different materials. For example, the sample may be a semiconductor device. Materials commonly used in semiconductor device include in particular copper, tantalum, silicon, silica, gallium, arsenic and others.

The treated sample is usually placed in a vacuum chamber on a sample holder located on a stage. The stage may be adapted for rotation around the normal of the sample surface.

The FIB is characterized by a FIB axis, accelerating energy and the type of ions used. Accelerating energy commonly used for sputtering may be in the range of 1-30 keV. The most commonly used ions are Ga ions formed by a liquid metal ion source or Xe ions formed by a plasma ion source. However, there are other modern ion sources such as those utilizing ionization by Cold atomic beam ion source, which enable generation of a wide range of different ions.

Changing the position of a sample between individual positions can take place at continuous sample scanning or interrupted scanning during position change. Uninterrupted scanning can be used especially when the sample is moved between rotation positions around the normal of the selected sample area.

The device for carrying out the invention may further comprise at least one signal particle detector. The detector can detect signal particles generated by gradual sputtering when scanning the surface of the scanning area. The signal generated by these particles can be processed by technical means for evaluation and display of the signal, which can subsequently generate and display a two-dimensional image of the scanned area on the sample during the removal of the layers.

Furthermore, the device may be provided with at least one other device generating a charged particle beam. For example, the device may be a scanning electron microscope or a scanning ion microscope. Using scanning microscope to obtain a surface image of the scanned area is generally known. In device for carrying out the method of the invention equipped with electron scanning microscope, it is possible to use secondary or back scattered electrons to observe sample sputtering when the sample is not subjected to the FIB. In case the scanning electron microscope is further equipped with a signal particle filtration device, said device may be used even while scanning with the FIB. While the incident FIB produces ion-induced secondary electrons and secondary ions, the electron beam incident on the sample produces secondary electrons and back scattered electrons. Since the secondary and back scattered electrons differ in their energy and trajectories, it is possible to separate these particles by filtration and to detect only the back scattered electrons on the detector. This makes it possible to observe the sample surface by a scanning electron microscope even during FIB sputtering.

EXEMPLARY EMBODIMENTS OF THE INVENTION

Figure 1:
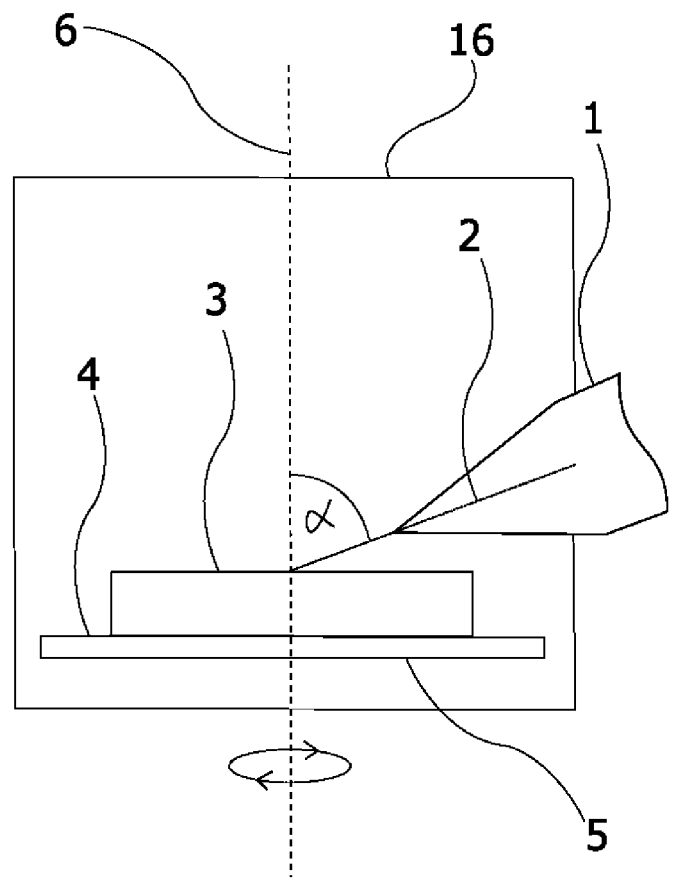
FIG. 1 A device for carrying out the invention
FIG. 2 Sputtering of the sample with two components
FIG. 3 A method of carrying out the invention
FIG. 4 Another method of carrying out the invention
FIG. 5 Exemplary results of carrying out the invention
FIG. 6 A device for carrying out the invention comprising a detector
FIG. 7 A device for carrying out the invention comprising a scanning electron microscope

FIG. 1 is a schematic illustration of a device for carrying out the invention. The device includes an ion column 1 for generating and guiding a focused ion beam having an axis 2. Along the axis 2, a focused ion beam can be propagated towards a sample 3. The sample 3 may be, for example, a semiconductor device. The sample 3 is located on a sample holder 4 which can be separable or inseparable from a stage 5. The stage 5 and the ionic column 1 are at least partially located within a vacuum chamber 16. Further, the stage 5 is provided with a movement mechanism allowing a rotary movement about a normal 6 of the sample 3 surface. The normal 6 of the sample 3 surface forms an angle $\alpha$ with the axis 2, which angle may be in the range of 70 to 90 degrees. As a rule, the higher the alpha angle, the flatter the surface can be achieved. From this point of view, the angle $\alpha$ of approximately 87 degrees appears to be the most preferable.

Figure 2A:
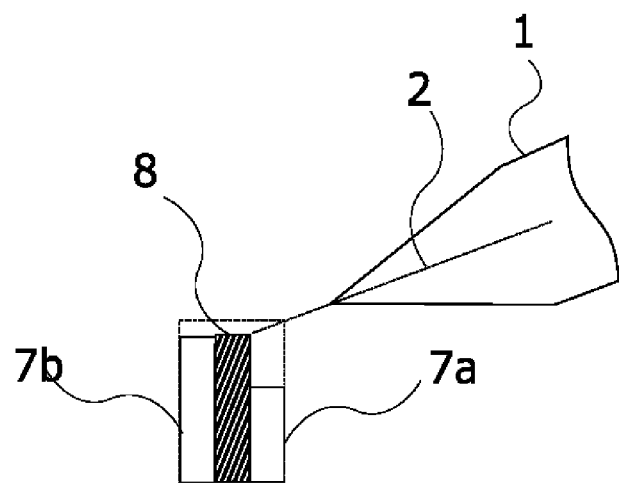

FIG. 2a is a schematic representation of sputtering of sample 3 in the first direction. Sample 3 includes components 7a, 7b with a higher sputtering rate, and a component 8 with a lower sputtering rate. While sputtering in the first direction, the component 7a with a higher sputtering rate is sputtered faster than component 8 with a lower sputtering rate. The component 7b with a higher sputtering rate is shielded by component 8 with a lower sputtering rate, and although it has a higher sputtering rate than the component 8 with a lower sputtering rate, it is removed at approximately the same rate as the component 8 with a lower sputtering rate.

Figure 2B:
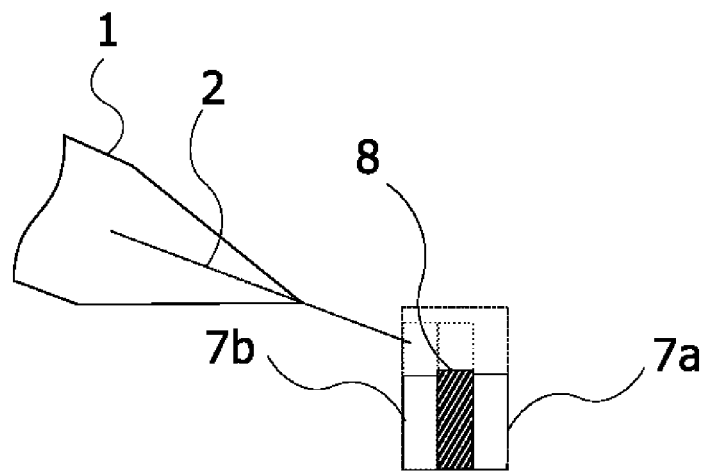

FIG. 2b is a schematic representation of the next step of sputtering the sample 3, i.e., sputtering in the second direction. The sample contains two components 7a, 7b with a higher sputtering rate, and a component 8 with a lower sputtering rate. The component 7b with a higher sputtering rate is sputtered faster than component 8 with a lower sputtering rate. On the contrary, the component 7a with a higher sputtering rate is shielded by the component 8 with a lower sputtering rate and sputtering almost does not occur until the component 8 with a lower sputtering rate is sputtered down to approximately the level of the component 7a with a higher sputtering rate.

Figure 3:
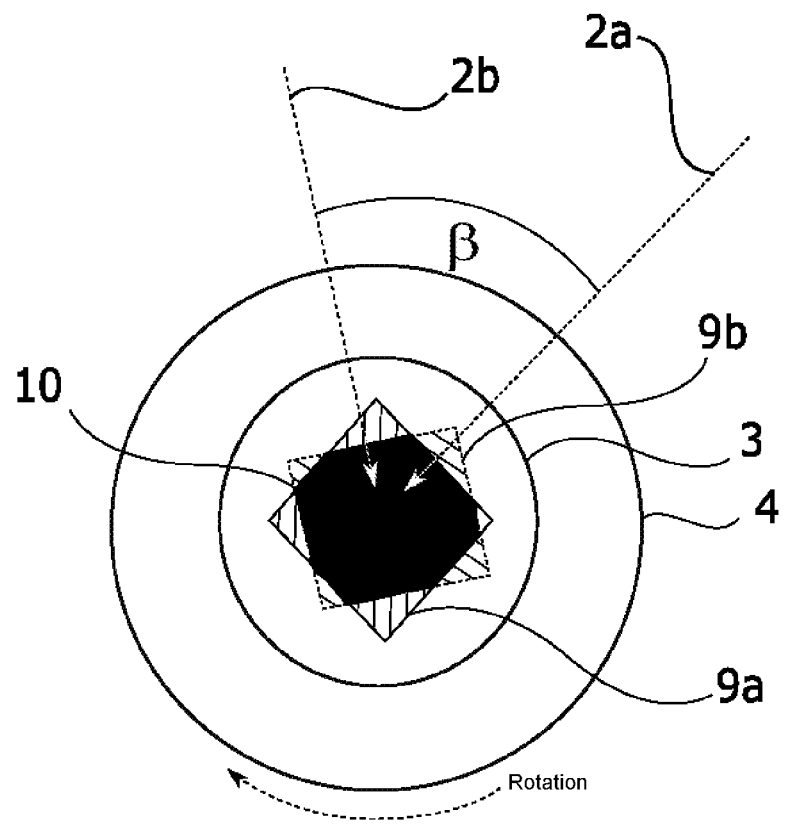

FIG. 3 is a schematic representation of an embodiment wherein a first scanning area 9a of a sample 3 located on a sample holder 4 is in a first step sputtered by a focused ion beam in a first sputtering direction 2a. In the second step, the sample 3 is placed in a second position and a second scanning area 9b is sputtered in a second sputtering direction 2b, wherein sputtering directions 2a, 2b are the projections of an axis 2 of the focused ion beam into a plane perpendicular to a normal 6 of the sample 3 surface and forming an angle $\beta$ of 45 degrees. Selected area 10 is located at the intersection of the scanning areas 9a, 9b.

Figure 4:
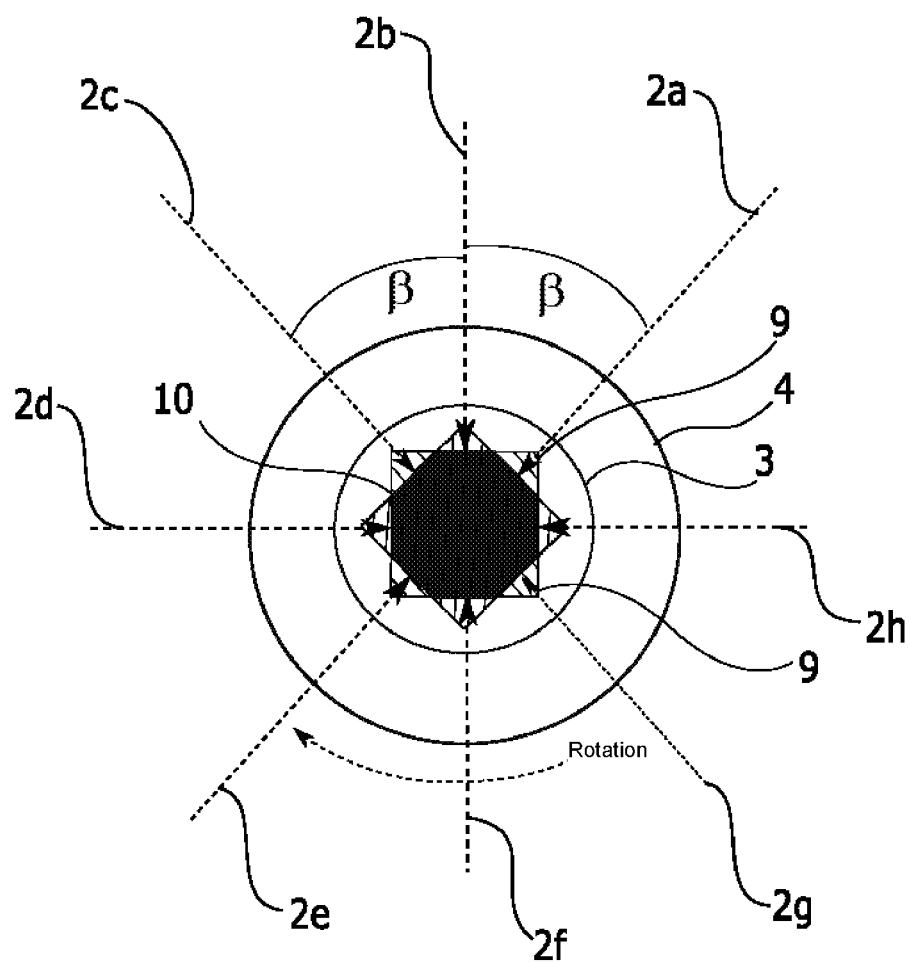

FIG. 4 shows a further embodiment in which a sample 3 is sputtered by focused ion beam sequentially from eight different sputtering directions 2a, 2b, 2c, 2d, 2e, 2f, 2g, 2h. These sputtering directions 2a, 2b, 2c, 2d, 2e, 2f, 2g, 2h form an angle $\beta$ of 45 degrees or its multiples between each other.

Figure 5:
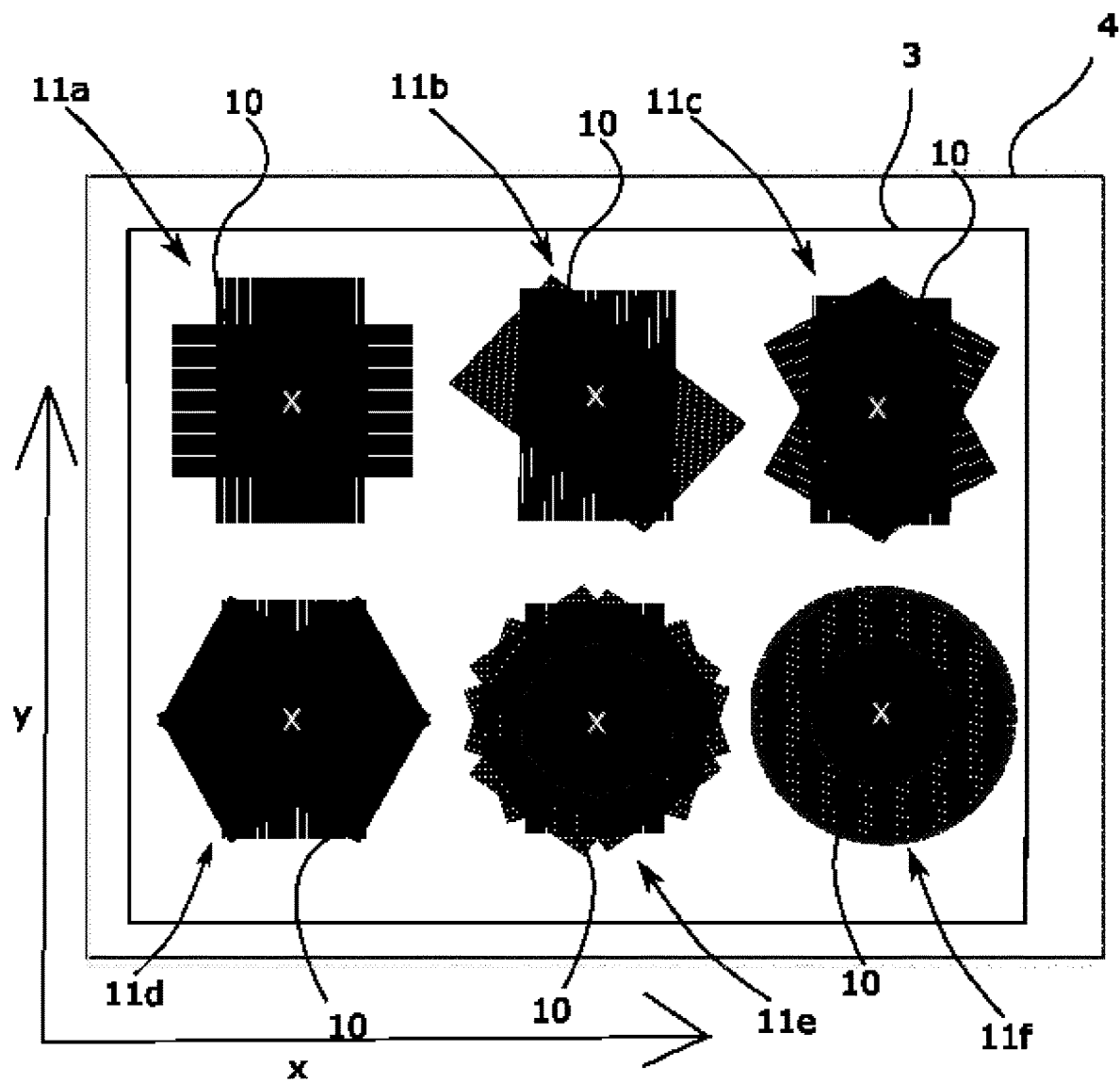

FIG. 5 shows some of the possible results 11a, 11b, 11c, 11d, 11e, 11f of invention embodiments. A sample 3 is located on a sample holder 4, which allows, in addition to rotation around a normal 6, shift in the direction of x and y axes. Axes x, y are perpendicular to one another. The shift and rotation of the sample holder 4 or the stage 5 enable easy creation of more discrete selected areas 10 on the sample 3.

In the result 11a of the embodiment, the sample 3 is sputtered in 4 directions, which form multiples of angle β of 90 degrees with one another.

In another result 11b of the embodiment, the sample 3 is sputtered in 4 directions, the first direction with the second direction and the third direction with the fourth direction forming angle β of 45 degrees with one another, and the second direction with the third direction and the fourth direction with the first direction forming angle β of 135 degrees.

In another result 11c of the embodiment, the sample 3 is sputtered in 6 directions, the first direction with the second direction, the third direction with the fourth direction, the fourth direction with the fifth direction and the sixth direction with the first direction forming angle β of 30 degrees between one another and the second direction with the third direction and the fifth direction with the sixth direction forming the angle β of 120 degrees.

In another result 11d of the embodiment, the sample 3 is sputtered in 6 directions, which form multiples of angle β of 60 degrees between one another.

In another result 11e of the embodiment, the sample 3 is sputtered in 10 directions, which form multiples of angle β of 36 degrees between one another.

In another result 11f of the embodiment, the sample 3 is sputtered continuously during the rotation of the sample 3 around the normal 6 of the respective point in the selected area 10.

Figure 6:
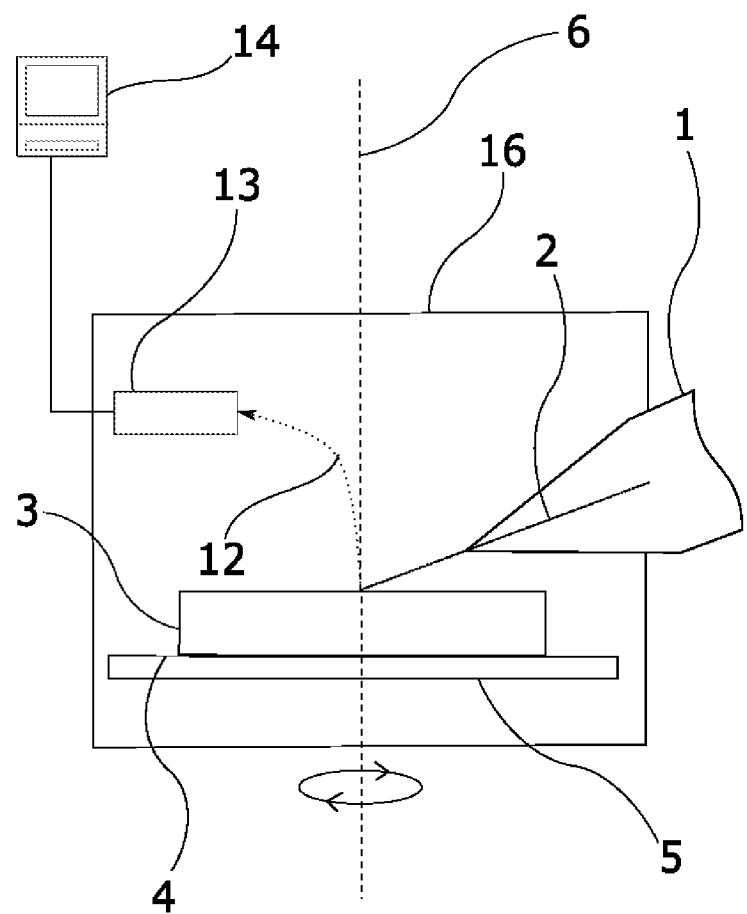

FIG. 6 is a schematic representation of another device for carrying out the invention. The device is, unlike the device in FIG. 1, additionally provided with a detector 13 of signal particles 12. The detector 13 is located inside a vacuum chamber 16. Signal particles 12, which are formed by sputtering the sample 3 surface with the focused ion beam, can be detected by the detector 13. Signal particles 12 on the detector 13 generate a signal, which is converted to the image of the sample 3 surface by technical means 14 for evaluation and display of the signal. Thus, sample 3 can be observed during sputtering. Signal particles 12 may be secondary ions or ion-induced secondary electrons.

Figure 7:
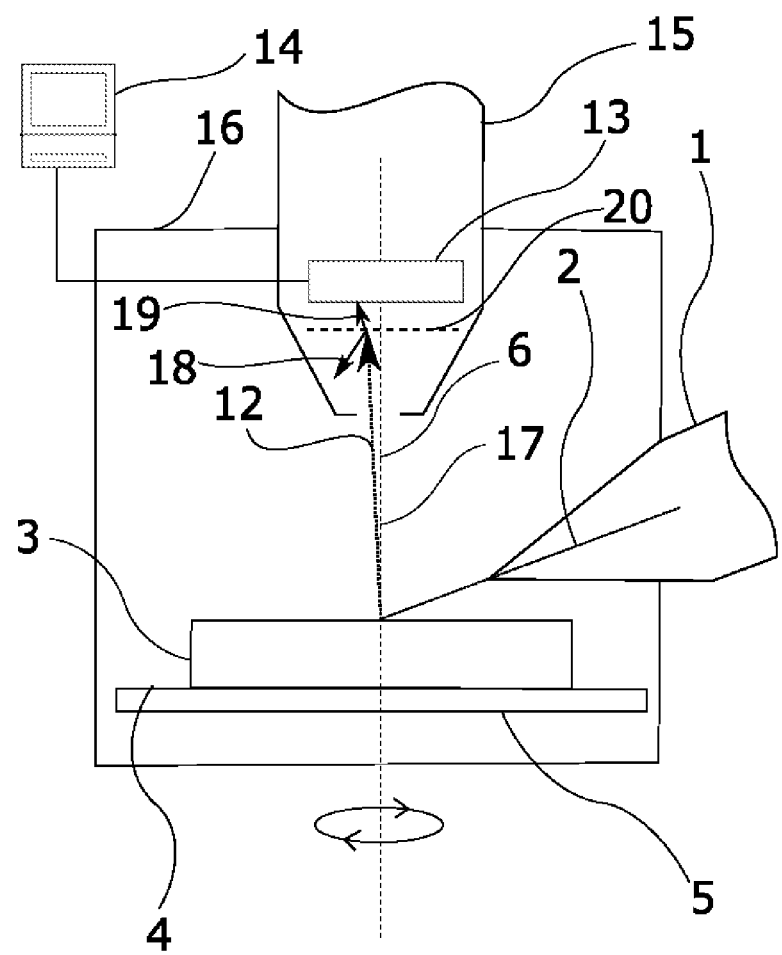

FIG. 7 is a schematic representation of another device for carrying out the invention. Unlike the embodiment in FIG. 6, the device comprises a scanning electron microscope 15 allowing forming an electron beam and directing it to sample 3 along an axis 17 of the electron microscope 15. The scanning electron microscope 15 further allows to deflect the electron beam from the axis 17 of the electron microscope 15 and to scan it over the sample 3 surface. Upon contact with the sample 3, the electron beam forms signal particles 12, consisting mainly of secondary electrons 18, back scattered electrons 19 and others. In the embodiment of the device according to FIG. 7, a detector 13 of signal particles 12 is further located within the column of the scanning electron microscope 15. The detector 13 is preceded by a filtration device 20, which in this case is a grid connected to a voltage source, allowing to divide signal particles 12 so that only back scattered electrons 19 can reach the detector 13 while secondary electrons 18 are deflected by the filtration device 20. Back scattered electrons 19 can thus be detected even when scanning by scanning electron microscope 15 and simultaneous sputtering by means of focused ion beam.

LIST OF REFERENCE SIGNS

1—Ion column
2—Axis
2a, 2b, 2c, 2d, 2e, 2f, 2g, 2h—Sputtering direction
3—Sample
4—Sample holder
5—Stage
6—Normal of the selected area
7a, 7b component with a higher sputtering rate
8—component with a lower sputtering rate
9, 9a, 9b—Scanning area
10—Selected area
11a, 11b, 11c, 11d, 11e, 11f—Embodiment result
12—Signal particle
13—Detector
14—Technical means for evaluation and display.
15—Scanning electron microscope
16—Vacuum chamber
17—Axis of the electron microscope
18—Secondary electrons
19—Back scattered electrons
20—Filtration device

The invention claimed is:

1. A method for removal of matter from a selected area on a sample of a semiconductor device comprised of at least two components of different sputtering rates by sputtering by means of scanning a surface of the sample by a focused ion beam, wherein the selected area is sputtered from at least two different sputtering directions such that
in the first step, the sample is placed in a first position relative to the focused ion beam and the selected area is sputtered in the first sputtering direction by the focused ion beam;
in at least one further step, the sample is placed in a second position relative to the focused ion beam and the selected area is sputtered in the second sputtering direction by the focused ion beam;
and that the change of position of the sample relative to the focused ion beam takes place by turning the sample around a normal of the selected area;
wherein the first sputtering direction and the second sputtering direction are rotated relative to one another by an angle β;
and at the same time an angle a that is formed by the normal of the selected area with an axis of the device is greater than 70 degrees and smaller than 90 degrees.

2. The method for removal of matter according to claim 1 wherein the value of the angle α is constant in all positions of the sample.

3. The method for removal of matter according to claim 1 wherein the selected area is sputtered from at least four directions.

4. The method for removal of matter according to claim 1 wherein at least 2 sputtering directions are rotated relative to one another by the angle 13 of 45 degrees.

5. The method for removal of matter according to claim 1 wherein the change of the sample position of the device relative to the focused ion beam is carried out while simultaneously sputtering by scanning the sample surface with the focused ion beam.

6. The method for removal of matter according to claim 1 wherein at least a portion of signal particles generated during the sputtering is detected on a detector and an image of the sample surface is generated from the signal obtained.

7. The method for removal of matter according to claim 1 wherein the sample surface is scanned by an electron beam and the generated signal particles are filtered, and the back scattered electrons are detected on the detector and an image of the sample surface is generated from the signal obtained.

8. The method for removal of matter according to claim 1 wherein displaying the selected area by detecting at least a portion of signal electrons takes place in an uninterrupted manner throughout the entire time of the sample sputtering by the focused ion beam.

\* \* \* \* \*